United States Patent
Hoff

(10) Patent No.: US 7,023,235 B2
(45) Date of Patent: Apr. 4, 2006

(54) REDUNDANT SINGLE EVENT UPSET SUPRESSION SYSTEM

(75) Inventor: James R. Hoff, Wheaton, IL (US)

(73) Assignee: Universities Research Association, Inc., Washington, DC (US)

( * ) Notice: Subject to any disclaimer, the term of this patent is extended or adjusted under 35 U.S.C. 154(b) by 122 days.

(21) Appl. No.: 10/735,489

(22) Filed: Dec. 12, 2003

(65) Prior Publication Data

US 2005/0127971 A1 Jun. 16, 2005

(51) Int. Cl.
*H03K 19/003* (2006.01)
(52) U.S. Cl. .......................... 326/10; 326/12
(58) Field of Classification Search ............ 326/21–28, 326/9–14, 82
See application file for complete search history.

(56) References Cited

U.S. PATENT DOCUMENTS

| | | | | |
|---|---|---|---|---|
| 5,418,473 A * | 5/1995 | Canaris | ........................ | 326/27 |
| 6,111,780 A * | 8/2000 | Bertin | ........................ | 365/154 |
| 6,275,080 B1 * | 8/2001 | Phan et al. | ................. | 327/200 |
| 6,417,710 B1 * | 7/2002 | Bartholet | .................... | 327/200 |
| 6,492,857 B1 * | 12/2002 | Shuler, Jr. | ................... | 327/225 |
| 6,504,410 B1 * | 1/2003 | Waldie et al. | .............. | 327/199 |
| 6,504,411 B1 * | 1/2003 | Cartagena | .................... | 327/199 |
| 6,637,005 B1 * | 10/2003 | Kohnen | ....................... | 714/797 |
| 6,657,472 B1 * | 12/2003 | Raza et al. | ................. | 327/217 |
| 6,696,873 B1 * | 2/2004 | Hazucha et al. | ............ | 327/203 |
| 6,756,809 B1 * | 6/2004 | Eaton | .......................... | 326/13 |
| 6,794,901 B1 * | 9/2004 | Bernstein et al. | ............. | 326/95 |
| 2004/0022005 A1 * | 2/2004 | Erstad | ......................... | 361/211 |

OTHER PUBLICATIONS (Mano, Morris, Digital Design, 1984, Prentice-Hall, Inc., pp. 204-209), no month.*

* cited by examiner

*Primary Examiner*—Don Le
(74) *Attorney, Agent, or Firm*—Kermit D. Lopez; Luis M. Ortiz; Ortiz & Lopez, PLLC

(57) ABSTRACT

CMOS transistors are configured to operate as either a redundant, SEU-tolerant, positive-logic, cross-coupled Nor Gate SR-flip flop or a redundant, SEU-tolerant, negative-logic, cross-coupled Nand Gate SR-flip flop. The register can operate as a memory, and further as a memory that can overcome the effects of radiation. As an SR-flip flop, the invention can be altered into any known type of latch or flip-flop by the application of external logic, thereby extending radiation tolerance to devices previously incapable of radiation tolerance. Numerous registers can be logically connected and replicated thereby being electronically configured to operate as a redundant circuit.

10 Claims, 11 Drawing Sheets

1200

1300

REDUNDANT SINGLE EVENT UPSET SUPRESSION SYSTEM

GOVERNMENT INTEREST

The United States Federal Government has right to this invention pursuant to Contract No. DE-AC02-76CH03000 between Universities Research Corporation and the United States Department of Energy.

FIELD OF THE INVENTION

The present invention is generally related to integrated circuit design. More particularly, the present invention is related to methods and systems preventing single event upset in integrated circuits and memory cells. Additionally, the present invention is related to methods and systems preventing upset in integrated circuits and memory cells by utilizing a design of redundant single event upset tolerant registers.

BACKGROUND

The effects of radiation on integrated circuits have been known for over thirty years. These effects can be broken down into two broad categories. The first category is "total dose effects" in which an integrated circuit gradually deteriorates due to the accumulated effect of all the damage done to the crystal structure by the many, many particles incident on it. In the 1980s and early 90s, these effects were mitigated by special "rad hard" processes. These rad hard processes were expensive because they required special processing steps to fabricate. Fortunately, the unstoppable drive towards smaller and smaller transistor sizes has allowed those skilled in the art to develop "radiation tolerant" layout techniques in deep sub-micron processes that are the cornerstone of modern silicon fabrication. These radiation tolerant layout techniques mitigate total dose effects at least as well if not better than the "rad hard" processes ever did. Moreover, the fact that radiation tolerant layout techniques use standard silicon processing makes them inexpensive and available to everyone. For these reasons, total dose harness can be viewed as a solved problem, though radiation tolerant layout techniques place restrictions on a designer's freedom, most notably on his or her ability to ratio transistors at will.

The second category of radiation effects is "single event effects" in which a single particle, either through its exceptionally high energy or through the accuracy of its trajectory through a semiconductor, is capable of affecting a circuit. Single event effects are varied, and most of the effects can be mitigated by proper layout techniques. One type of single-event effect in particular requires more effort to eliminate, however, and that is the single event upset or SEU in which the contents of a memory cell are altered by an incident particle.

SEUs belong to a class of errors called "soft-errors" in that they simply reverse the state of a memory. They do not, in and of themselves, damage a circuit. This does not mean, however, that they can be ignored. Single event upsets in a computer alter the computer's internal state, "confusing" the computer and potentially crashing the system. In the case of computers that control satellite systems or machinery, this can be catastrophic. Single event upsets in medical imaging and scientific experiment can result in noisy signals and data loss, requiring higher intensities and longer exposure times to overcome the noise.

A number of SEU-hardening techniques have been employed in the past. These techniques can be divided into three types. The first type is technology hardening in which changes are made to the fabrication of the chip such that critical charges necessary for single-event upset to occur do so with reduced frequency. One example of technology hardening is Silicon-on-Sapphire or SOS in which the chip is grown on an insulator to reduce the charge build-up due to incident particles. The second type of SEU hardening is passive hardening in which passive components like capacitors or resistors are added to a circuit to either slow it down or to increase the charge required to reverse its state. Finally, the third type of SEU hardening is design hardening in which redundancy and feedback are added to a circuit to make it immune to single events.

Technology hardening is not generally viable commercially because the silicon industry has become accustomed to its fabrication methods for which it has spent billions of dollars to develop. Passive hardening is not efficient. Although it is a workable solution, it is a deliberate slowing-down of information processing, which is at odds with the clear industry objective to speed up processing. Moreover, passive hardening is not scalable, therefore fabrication changes from 0.5 μm to 0.25 μm to 0.18 μm requires passive hardening redesign and re-testing. Design hardening, on the other hand, is limited only by the creativity of the designers.

Computer memory comes in different forms. The two most common categories are SRAM and DRAM. Both are ubiquitous in modern digital design. DRAM or Dynamic Random Access Memory is smaller and generally slower. They are used for mass storage and their contents must continually be refreshed or the values they hold will be lost. SRAM or Static Random Access Memory is larger and faster and they will hold their contents indefinitely without external intervention. Both types of memory are subject to radiation effects.

Most single event upset tolerant SRAM cells (hereinafter "cells") are clocked, D-type latches, which is to say that they obey the logical flow shown in Table 1. In short, when Clock is low, Next State equals Previous State. When Clock is High, Next State equals Data. Per se, there is nothing wrong with a D-type latch. It is the single most common type of latch since the dawn of the ASIC age. It is not the only type of latch however.

TABLE 1

Logical Flow of a Clocked, D-Latch

| Clock | Input Data | Present State | Next State |
|---|---|---|---|
| 0 | 0 | 0 | 0 |
| 0 | 0 | 1 | 1 |
| 0 | 1 | 0 | 0 |
| 0 | 1 | 1 | 1 |
| 1 | 0 | 0 | 0 |
| 1 | 0 | 1 | 0 |
| 1 | 1 | 0 | 1 |
| 1 | 1 | 1 | 1 |

Another common type of latch is the SR or Set-Reset Latch. These latches obey the logical flow shown in Table 2. In short, when Set is active and Reset is inactive, regardless of the present state, the latch changes its state to a 1. When Reset is active and Set is inactive, regardless of the present state, the latch changes its state to a 0. When Set and Reset are both inactive, the latch holds the present state. Finally, Set and Reset are not allowed to be active simultaneously.

Note that in these preceding sentences, Set and Reset are referred to as being either "active" or "inactive" rather than explicitly "1" or "0". This is the concept of positive logic or negative logic and it is important for SR-Latches. Positive Logic means a 1 is active and a 0 is inactive. Negative Logic means a 0 is active and a 1 is inactive. Therefore, Table 2 actually shows the Logical Flow of a Positive Logic SR-Latch. The Logical Flow of a Negative Logic SR-Latch is identical except that a 1 is substituted for every 0 in both the S and R columns (but not the Present State or Next State columns) and a 0 is substituted for every 1 in both the S and R columns (but not the Present State or Next State columns).

TABLE 2

Logical Flow of an SR-Latch
(Positive Logic)

| S | R | Present State | Next State |
|---|---|---|---|
| 0 | 0 | 0 | 0 |
| 0 | 0 | 1 | 1 |
| 0 | 1 | 0 | 0 |
| 0 | 1 | 1 | 0 |
| 1 | 0 | 0 | 1 |
| 1 | 0 | 1 | 1 |
| 1 | 1 | 0 | U |
| 1 | 1 | 1 | U |

Two fundamental building blocks of logic design are the Nand gate and the Nor gate. The Nand or "not and" gate obeys the logical flow shown in Table 3. The Nor or "Not or" gate obeys the logical flow shown in Table 4.

TABLE 3

Logical Flow of a Nand Gate

| A | B | A AND B | NAND(A, B) |
|---|---|---|---|
| 0 | 0 | 0 | 1 |
| 0 | 1 | 0 | 1 |
| 1 | 0 | 0 | 1 |
| 1 | 1 | 1 | 0 |

TABLE 4

Logical Flow of a Nand Gate

| A | B | A OR B | NOR(A, B) |
|---|---|---|---|
| 0 | 0 | 0 | 1 |
| 0 | 1 | 1 | 0 |
| 1 | 0 | 1 | 0 |
| 1 | 1 | 1 | 0 |

In logic design, a negative logic canonical SR flip-flop is formed by cross-coupling Nand gates as shown in FIG. 1A. A canonical positive logic SR flip-flop is formed by cross-coupling Nor gates as shown in FIG. 1B.

SR flip-flops are considered the fundamental building blocks of sequential design (i.e. logic design with memory). D-latches are common in modern ASIC design because 1) the specialized computer industry generally want to latch and hold data and that is what a D-latch does and 2) D-latches can easily be designed in modern integrated circuit processes. SR latches are more fundamental than D-latches, however, because you can convert an SR-latch into a D-latch with one external gate, but you cannot convert a D-latch into an SR latch. You can convert an SR-latch into a clocked D-latch with three external gates. In short, an SR-latch can be converted into any other type of latch with a simple application of external logic. From a logic designer's point of view, the SR latch is easily the most flexible type of latch available.

Although there are two categories of radiation effects, total dose and single event, neither category are necessarily lumped together. There are instances when applications require single event immunity but not necessarily total dose immunity (such as a device that is only going to be exposed to radiation for a short time (e.g., X-ray detectors for medical imaging) and there are instances when applications require total dose immunity but not single event immunity. Nevertheless, it is most typical that a device be both total dose and single event tolerant. Unfortunately, many existing single event upset tolerant SRAM cells were designed for rad hard processes and they accomplish their SEU tolerance through highly specific transistor ratioing. This is to say that, in order for the circuits to function properly, certain transistors must be made weak and others must be made very strong. This adjusting of transistor strength is called "transistor ratioing" because the ratio of the size of two transistors determines their relative strength.

As stated earlier, radiation tolerant design techniques in deep submicron processes are very effective, but they dramatically limit a designer's freedom to ratio his or her transistors and because of that, they also limit the number of SEU tolerant architectures that can be designed using radiation tolerant techniques. Some existing cells can be redesigned such that the burden of ratioing is born entirely by the p-type transistors, which are unaffected by the limitations imposed by radiation tolerant layout techniques. If a particular SEU tolerant architecture requires ratioing of its n-type transistors, however, then the chances are very good that SEU tolerant architecture simply cannot be realized in a modern, cost-effective integrated circuit process. Moreover, if a cell requires ratioing to accomplish its objectives (even ratioing of its p-type transistors), then the speed, size, power consumption, and, ultimately, SEU tolerance of that cell will be intimately related to the ratios chosen by the designer. This will be an issue whenever the device is scaled from one technology to another. Scaling from one process to another, (e.g., changing from 0.25 µm to 0.18 µm), can be problematic. Scaling problems are rarely insurmountable, but improperly scaled circuits are often the cause of failure in technology transfers. Few cells can be designed exclusively with minimum-sized transistors.

Many cells require that the internal state of the cell be overdriven by external circuitry. For example, the DICE cell 200, which is labeled as "prior art" and is illustrated in FIG. 2 shows that either transistor P2 (if the cell is holding a 1) or transistor N2 (if the cell is holding a 0) are driving Node A. Similarly, either transistor P4 or transistor N4 is driving Node B. When CLK is active, both Node A and Node B will be connected to Node D, and whatever external circuit is driving Node D will have to overcome the strength of the transistors driving Nodes A and B if it is to change the internal state of the DICE cell. This phenomenon is called overdriving. First when circuits must be overdriven, it underscores the necessity of transistor ratioing.

External transistors must be more powerful (i.e., larger) than the transistors inside the cell. This can be troublesome in a shift register configuration or even a master-slave flip-flop configuration when one cell is driving another of the same type. If both the master and the slave are of the same type, then, by definition, the transistors in the external circuitry (the master) are not larger than the transistors inside the cell (the slave). Second, overdriving requires power when changing a state. The external transistors must drive the internal nodes to the reverse condition even though the internal transistors are trying to maintain their original condition. Accordingly, the power and ground are briefly shorted to one another through the internal and external transistors.

Most cells cannot be asynchronously set or reset without undesirable modifications to their internal structure. In the past, if a set or a reset were required, they were carried out synchronously—in other words, in the presence of a clock. This is not always the best approach for system designs. In fact, many systems require considerable work to guarantee a synchronous reset. Moreover, in the absence of a clock, a synchronously reset system cannot be reset. Therefore, if the clock itself is the problem, there is no way of recovering to a known state. Asynchronous sets and resets are, by a wide margin, the preferred approach by many organizations working in high radiation environments, and virtually all industrial applications in non-radiation environments.

Most existing SEU tolerant cells perform the job they are designed to do, to a greater or lesser degree. In other words, they store data and they mitigate single event upsets. All cells, however, suffer from limitations. It would therefore be desirable to have SEU tolerant circuits that are more flexible logically, require no transistor ratios and could be designed in the minimum sized transistors available to any process, are designable in either specifically Rad hard processes or standard commercial processes or standard commercial processes using radiation tolerant layout techniques, are inherently scalable from process to process, require no overdriving of its internal state, and permit asynchronous sets and resets.

SUMMARY OF THE INVENTION

It is a feature of the present invention to provide a single event upset (SEU) tolerant SR-latch.

It is a feature of the present invention that the SEU tolerant SR-latch can be fabricated in any modern integrated circuit process that provides complementary transistors. It can be designed for rad hard processes or not. If commercial, non-rad hard processes are used, it can be designed using radiation tolerant layout techniques or standard rectangular design. It can also be used in Silicon-Germanium or Galium-Arsenide processes, as well, provided complementary transistors are available.

It is a feature of this present invention its layout is flexible. In its implementation, it most closely resembles modern CMOS design. In other words, all inputs are transistor gates. All outputs are transistor drains. Circuit behavior arises from the use of complementary transistors (i.e. one n-type and one p-type transistor gate is tied to each input). Circuit behavior is not dependent on the relative strengths of different transistors within the circuit. Therefore, minimum sized transistors—however that is defined by the application—can always be used. No scaling is required in order to make the design functional. Scaling of n-transistors relative to p-transistors will adjust the rise and fall time of the cell, but will not ultimately affect the function of the cell. Finally, if desired by a user, the entire Seuss Cell can be scaled to adjust its drive capacity or propagation delay or physical size, but, again, this will not ultimately affect the function of the cell.

It is another feature of this present invention that it is logically flexible. Where the present invention is configured as an SEU tolerant SR flip-flop, it can be converted into any known type of latch (e.g. SR latch, D-latch, clocked D-latch, T-flip-flops, JK flip-flops, etc.) by simple applications of external logic and without altering the internal architecture. This has two benefits. First, the type of latch available to the designer no longer limits designs. Second, the SEU tolerance of the register is not affected by the addition of external logic. The SR latch has essentially the same SEU tolerance as the clocked D-latch and the JK flip-flop.

It is yet another features of the present invention that it is inherently scalable from one process to another. It does not matter what size the internal transistors of the present invention are; therefore, it does not matter what process they are designed in.

It is yet another feature of the present invention that cells not require overdriving.

It is yet another feature of the present invention that, from the perspective of a designer, it is reliable and predictable. When overdriving is required, process variations can render a design non-functional. In the present invention, however, changing the inputs is guaranteed to change the outputs because all inputs are gates and overdriving is not required. The change of output is only a matter of time relative to the change of input. The time required to do this is well and reliably predicted by modern Computer-Aided Design (CAD) software. Therefore, the performance of the present invention can always be reliably predicted before a company spends the money to fabricate a design.

It is also another feature of this present invention that it behaves in all ways as an SR-flip flop. Therefore, there are two Seuss Cells—one that behaves as a negative-logic, cross-coupled Nand Gate SR-latch and one that behaves as a positive-logic, cross-coupled Nor Gate SR-latch.

It is a feature of this present invention that it can be set or reset either synchronously or asynchronously, as the designer desires. This is an application of external logic around an SEU tolerant SR-flip flop. The SEU tolerance of the cell is unaffected by this.

It is a feature of this present invention that, because asynchronous sets and resets are possible, external, and redundant circuitry with auto-correction can be easily added to this present invention to increase its SEU tolerance even further.

Additional features will be understood after reading the present description.

DETAILED DESCRIPTION OF EMBODIMENTS

Figure 3:
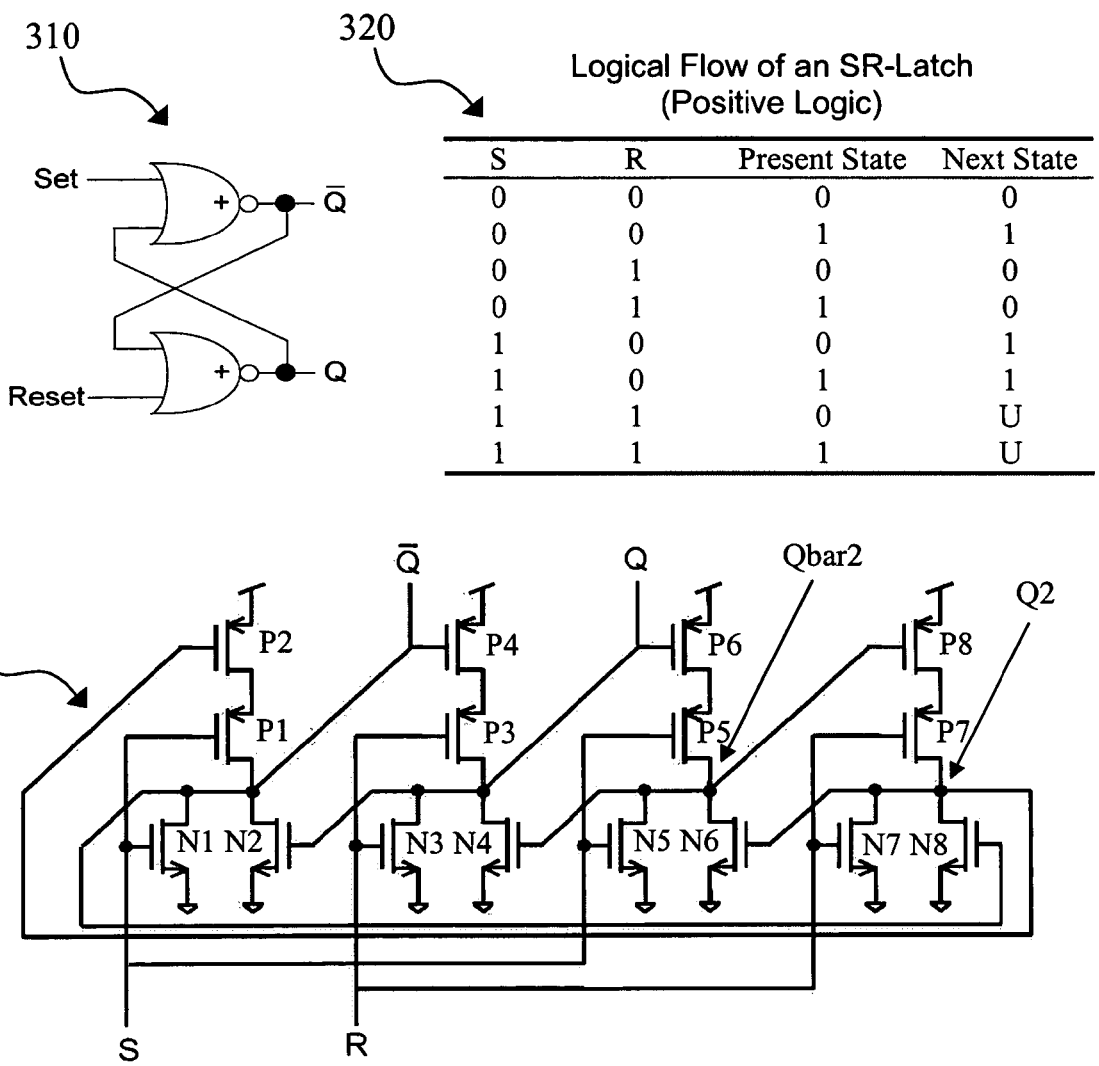
FIG. 3 illustrates schematic circuitry for a semiconductor cell referred to as a SEUSSNor and designed in accordance with embodiments of the present invention, and which behaves like an SEU tolerant positive-logic SR-latch formed from cross-coupled Nor Gates.

A schematic diagram for a single event upset tolerant positive logic SR flip-flop 300 is shown in FIG. 3 along with the canonical schematic 310 it emulates and a table 320 of the logic it performs. Since this SEUSS Cell emulates a cross-coupled Nor Gate SR flip-flop, it is called a SEUSS-Nor. According to the schematic, a cell can be provided having inputs S and R. Inputs S and R only drive the gates of transistors (N1, P1), (N3, P3), (N5, P5), and (N7, P7).

External circuitry driving the cell cannot possibly experience any "back drive" (i.e., no current is driven back out the inputs by the SEUSSNor towards the external circuitry) because CMOS gates are insulators. Moreover, regardless of how weak the external circuitry is and regardless of how strong the SEUSSNor's internal circuitry is made, the next state is the inevitable result of the inputs only. Stronger internal circuitry simply increases the input capacitance of the SEUSSNor. Weaker external circuitry simply increases the time required by the external circuitry to charge the input capacitance of the SEUSSNor. In either case, the SEUSSNor must ultimately respond to the change in input. It is only a matter of time. Because the inputs are gates, the SEUSSNor, unlike existing SEU tolerant SRAM cells, never actively prevents a state change from occurring. Back drive has been eliminated.

The complementary nature of the input transistor pairs eliminates overdrive:

When S is a logical 1, N1 is on and P1 is off. Similarly, N5 is on and P5 is off.

When S is a logical 0, N1 is off and P1 is on. Similarly, N5 is off and P5 is on.

When R is a logical 1, N3 is on and P3 is off. Similarly, N7 is on and P7 is off.

When R is a logical 0, N3 is off and P3 is on. Similarly, N7 is off and P7 is on.

Figure 4:
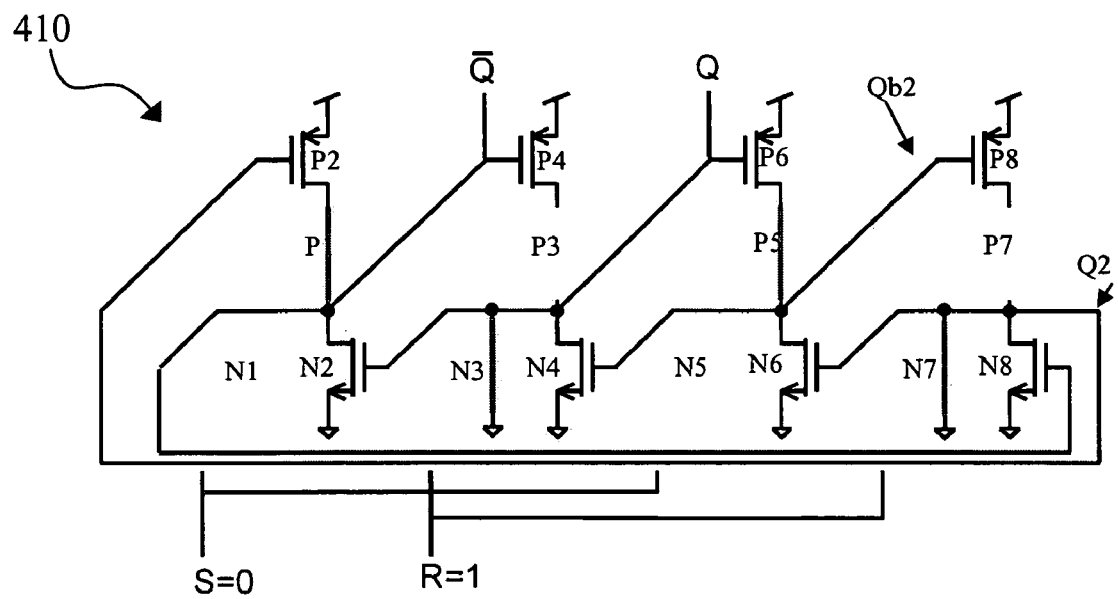
FIG. 4 illustrates schematic circuitry for a SEUSSNor in the Reset Condition.

Referring to FIG. 4 a SEUSSNor 400 under a Reset (S=0 and R=1) is shown. Transistors that are off (open) under these conditions (N1, N5, P3, and P7) have been removed from FIG. 3. Transistors that are on (closed) under these conditions (P1, P5, N3 and N7) have been replaced with wires. It is easy to see that under these conditions, nodes Q and Q2 are immediately pulled to ground (logical 0). Moreover, nothing can prevent those nodes from being pulled to ground because transistors P3 and P7 (which are off) cut those nodes away from any transistors that might try to pull those nodes to a logical 1. Once Q and Q2 are at a logical 0, transistors N2 and N6 are turned off while transistors P2 and P6 are turned on, pulling nodes Qbar and Qb2 high without opposition. With these last two nodes pulled to a logical 1, N4 and N8 are turned on and P4 and P8 are turned off, locking the new state (Q=0, Qbar=1), as required by the Reset.

Figure 5:
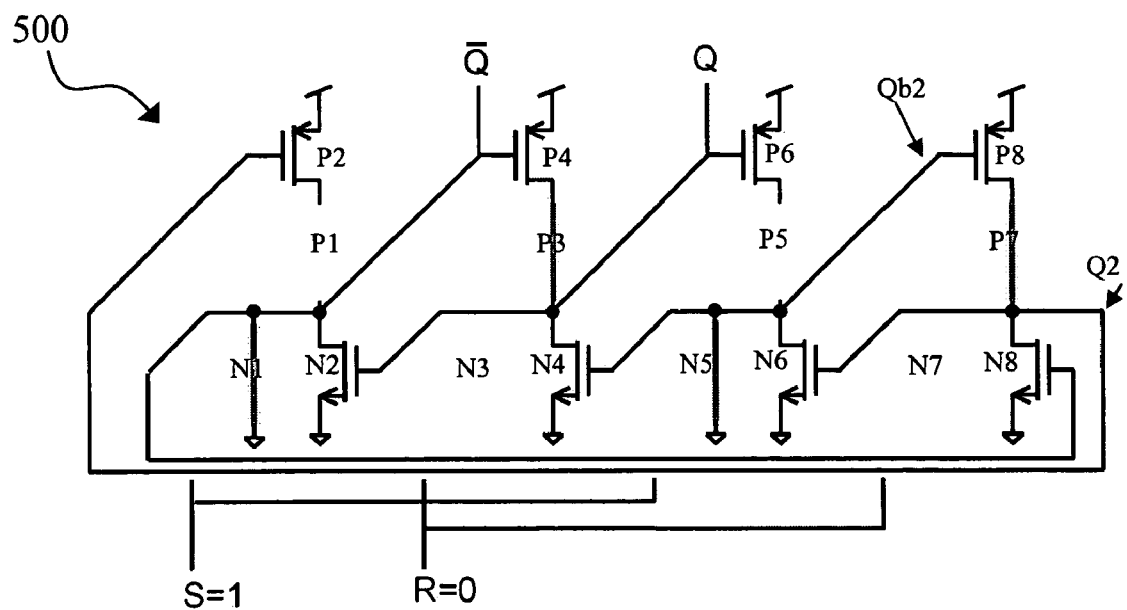
FIG. 5 illustrates schematic circuitry for a SEUSSNor in the Set Condition.

Referring to FIG. 5 a SEUSSNor under a Set (S=1 and R=0) is shown. Transistors that are off (open) under these conditions (P1, P5, N3, and N7) have been removed from FIG. 5. Transistors that are on (closed) under these conditions (N1, N5, P3 and P7) have been replaced with wires. It is easy to see that under these conditions, nodes Qbar and Qb2 are immediately pulled to ground (logical 0). Moreover, nothing can prevent those nodes from being pulled to ground because transistors P1 and P5 (which are off) cut those nodes away from any transistors that might try to pull those nodes to a logical 1. Once Qbar and Qb2 are at a logical 0, transistors N4 and N8 are turned off while transistors P4 and P8 are turned on, pulling nodes Q and Q2 high without opposition. With these last two nodes pulled to a logical 1, N2 and N6 are turned on and P2 and P6 are turned off, locking the new state (Q=1, Qbar=0), as required by the Set.

Figure 1:
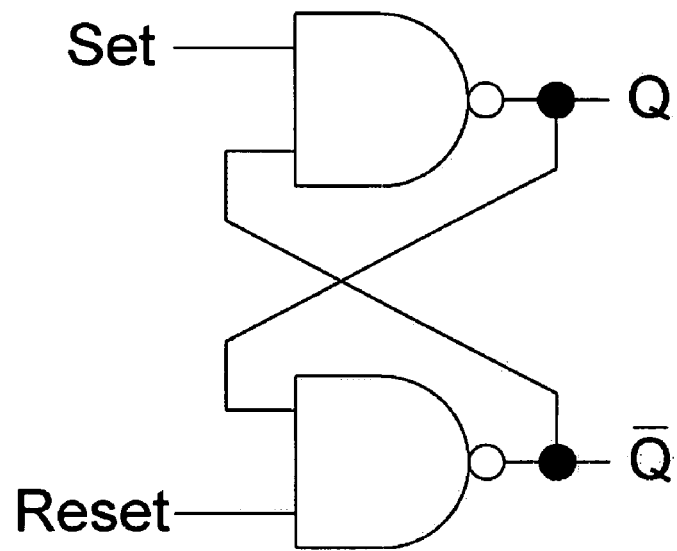
FIG. 1A, illustrates a canonical negative logic SR flip-flop is formed by cross-coupling Nand gates as shown in FIG. 1A.
FIG. 1B, illustrates a canonical positive logic SR flip-flop is formed by cross-coupling Nor gates as shown in FIG. 1B.
Figure 1B:
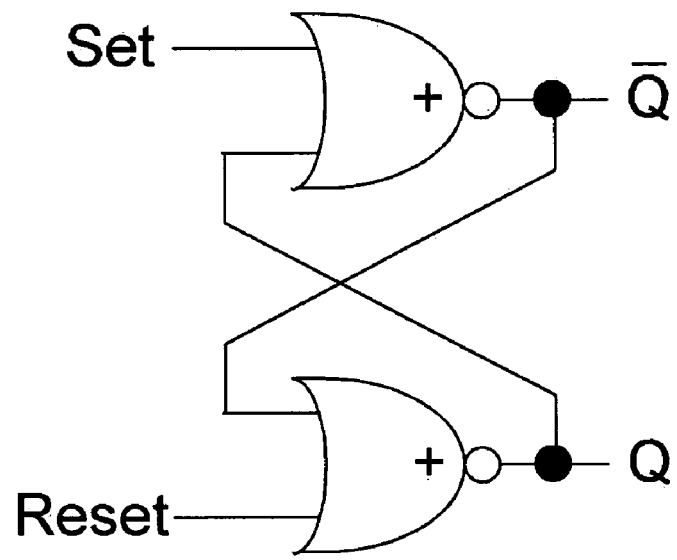
Figure 2:
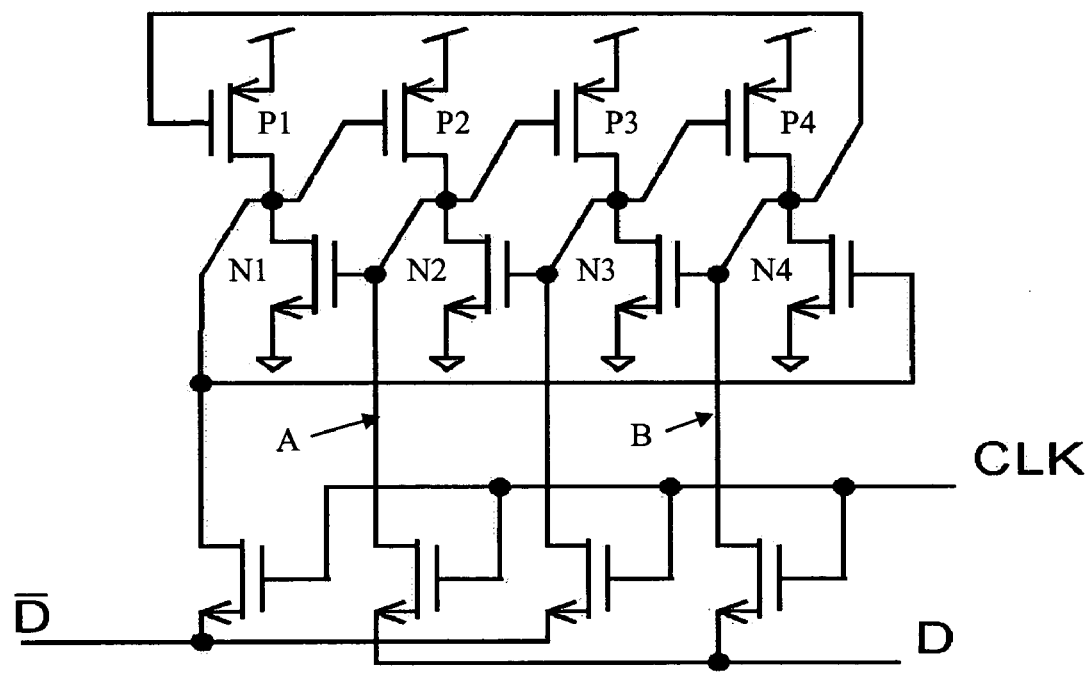
FIG. 2, labeled as Prior Art, illustrates schematic circuitry for a DICE cell, which is a commonly known SEU tolerant clocked D-latch.
Figure 6:
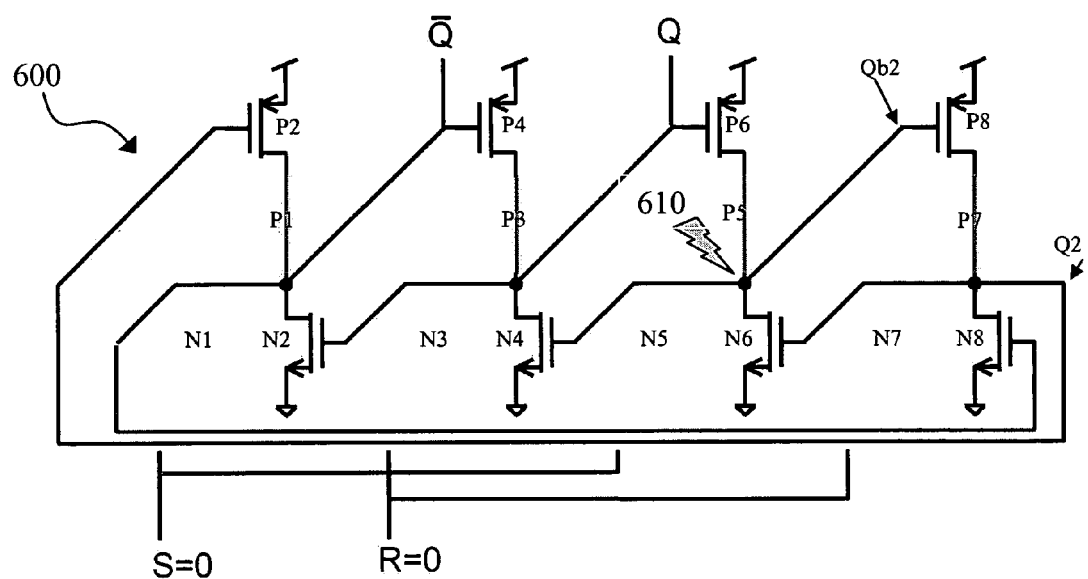
FIG. 6 illustrates schematic circuitry for a SEUSSNor in the Hold Condition.

Referring to FIG. 6 a SEUSSNor under a Hold (S=0 and R=0) is shown. If both S and R are set to Zero, then N1, N3, N5, and N7 are all cut off. Meanwhile, P1, P3, P5, and P7 are all shorted. Note that under these conditions, the SEUSS-Nor now actually resembles the DICE cell (FIG. 2) minus its input transistors. If Q is a One, then so is Q2, and Qbar and Qbar2 are Zeros. Under these conditions, P6 and P2 are cut off, severing Nodes Qbar and Qbar2 from power. Meanwhile, P4 and P8 are shorted, holding Q and Q2 as logical Ones. Also, N4 and N8 are cut off, severing Q and Q2 from ground while N2 and N6 are shorted to ground holding Qbar and Qbar2 as logical Zeros. In other words, if Nodes Q and Q2 are both logical Ones, then they are held as logical Ones when S and R are both Zeros. Similarly, if Nodes Q and Q2 are both logical Zeros, then they are held as logical Zeros when S and R are both Zeros.

If both S and R of a SEUSSNor are set to One, then there are multiple shorts from power to ground, and it is impossible to predict what state the circuit is in. This is an unknown state.

From the preceding paragraphs, it is obvious that under all conditions the SEUSSNor cell obeys the canonical form of a cross-coupled Nor Gate, positive-logic SR flip-flop depicted in the table embedded within FIG. 3. Assuming that the SEUSSNor is holding a logical 1 (i.e. Q=1, Qbar=0, Q2=1, and Qb2=0), and that there is upset as shown in FIG. 6 by the lightening bolt 610, the upset can deposit charge on Qb2 that would pull it up or down in voltage. Of course, an upset that pulls Qb2 down would have no effect on the state of the SEUSSNor because, under the present assumptions, Qb2 is already low. Several things happen, however, if the upset tries to pull Qb2 up. Transistor N6 will immediately attempt to pull Qb2 back down. Moreover, the gate of transistor N6 is controlled by node Q2. Q2 itself is controlled by transistors P8 and N8. The gate of N8 is unaffected by the upset and N8 will remain cut off (the gate of N8 is controlled by Qbar, which is a 0). Qb2, the node that is being upset, controls the gate of P8. If Qb2 is low, P8 actively pulls Q2 to high. If Qb2 is high, P8 is cut off, and nothing pulls Q2 high. Since this upset is driving Qb2 high, P8 will be cut off. The voltage value of node Q2 will remain unchanged (high) because nothing is pulling it low and it is that voltage on Q2 that will continue to keep transistor N6 alive and restoring the upset Qb2 back to its nominal value. Similarly, the voltage on Qb2 controls the gate of N4. If Qb2 is low, N4 is cut off. If Qb2 is high, N4 actively tries to pull node Q to ground. However, P4 is still on and controlled by Qbar, which is unaffected by the upset. Therefore, the voltage value of node Q will change but it will move from its nominal value slowly, under the conflicting influence of both N4 and P4.

The single event upset, on the other hand, is a rapid event, and N6 will be restoring Qb2 to its nominal value faster than Q will be moving away from its nominal value. Moreover, as the upset is restored through N6 and Qb2 is returned to its nominal value, transistor N4 will become weaker and weaker until it is finally cut off. Then P4 will restore Q to its nominal value, and the upset will be mitigated.

The internal transistors of a SEUSSNor (N1, P1), (N2, P2), (N3, P3), (N4, P4), (N5, P5), (N6, P6), (N7, P7), and (N8, P8) can be made as large or as small as desired. In short, the unique cell design set forth herein in accordance with features of the present invention requires no transistor ratios and could be designed in the minimum sized transistors available to any process, is alternatively designable in either specifically rad-hard processes, standard commercial processes or standard commercial processes using radiation tolerant layout techniques, is inherently scalable from process to process, and requires no overdriving of its internal state.

Figure 7:
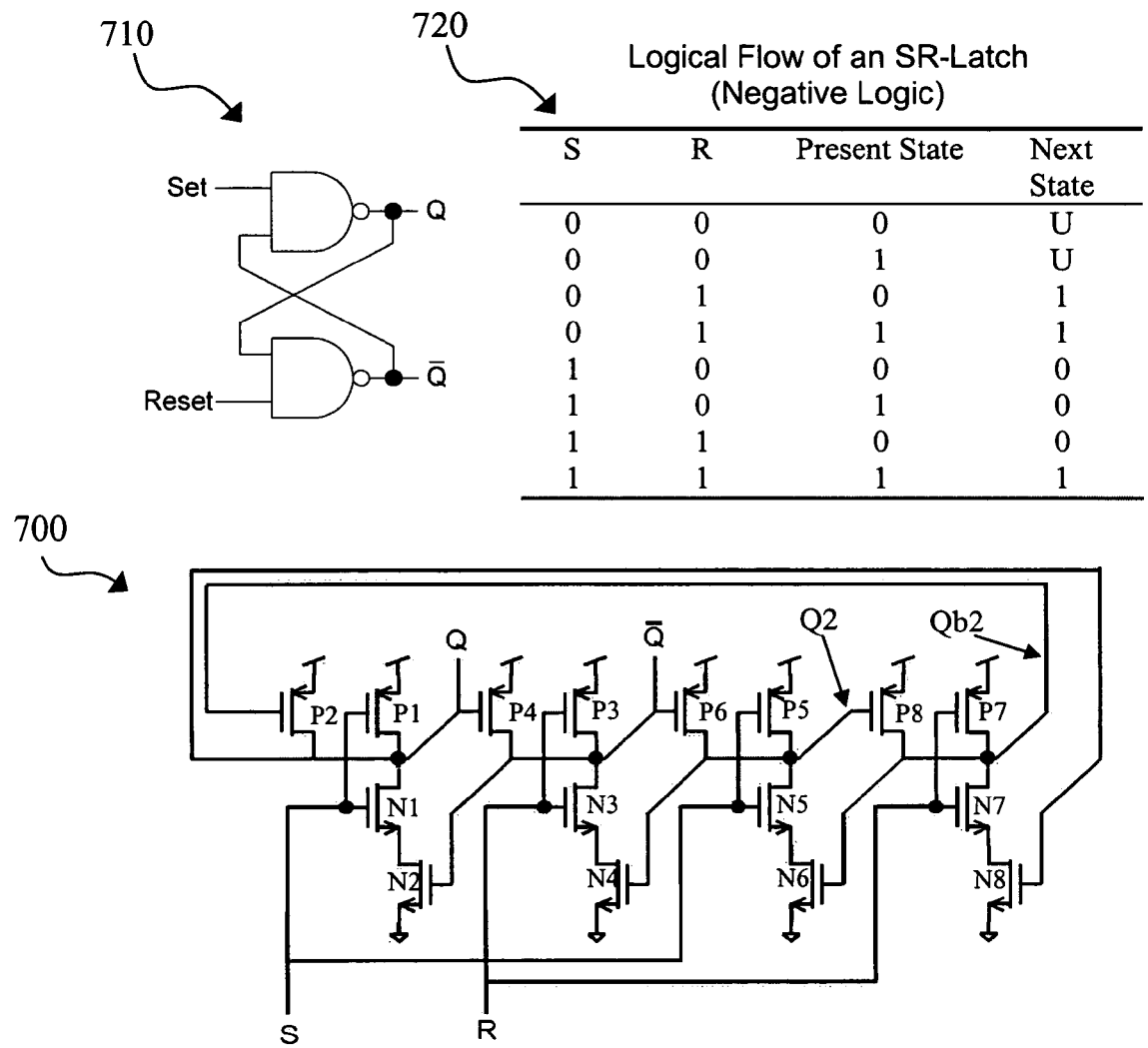
FIG. 7 illustrates schematic circuitry for a semiconductor cell referred to as a SEUSSNand and designed in accordance with embodiments of the present invention, and which behaves like an SEU tolerant negative-logic SR-latch formed from cross-coupled Nand Gates.

A schematic diagram for a single event upset tolerant negative logic SR flip-flop 700 is shown in FIG. 7 along with the canonical schematic 710 it emulates and a table 720 of the logic it performs. This SEUSS Cell is called the SEUSSNand because it emulates a cross-coupled Nand Gate SR flip-flop. According to the schematic, a cell can be provided having inputs S and R. Inputs S and R only drive the gates of transistors (N1, P1), (N3, P3), (N5, P5), and (N7, P7). Since CMOS gates are insulators, external circuitry driving the cell cannot possibly experience any "back drive" (i.e. no current is driven back out the inputs by the SEUSSNor towards the external circuitry). Moreover, regardless of how weak the external circuitry is and regardless of how strong the SEUSSNand's internal circuitry is made, the next state is the inevitable result of the inputs only. Stronger internal circuitry simply increases the input capacitance of the SEUSSNand. Weaker external circuitry simply increases the time required by the external circuitry to charge the input capacitance of the SEUSSNand. In either case, the SEUSSNand must ultimately respond to the change in input. It is only a matter of time. Because the inputs are gates, the SEUSSNand, unlike existing SEU tolerant SRAM cells, never actively prevents a state change from occurring. Back drive has been eliminated.

The complementary nature of the input transistor pairs eliminates overdrive.

When S is a logical 1, N1 is on and P1 is off. Similarly, N5 is on and P5 is off.
When S is a logical 0, N1 is off and P1 is on. Similarly, N5 is off and P5 is on.
When R is a logical 1, N3 is on and P3 is off. Similarly, N7 is on and P7 is off.
When R is a logical 0, N3 is off and P3 is on. Similarly, N7 is off and P7 is on.

Figure 8:
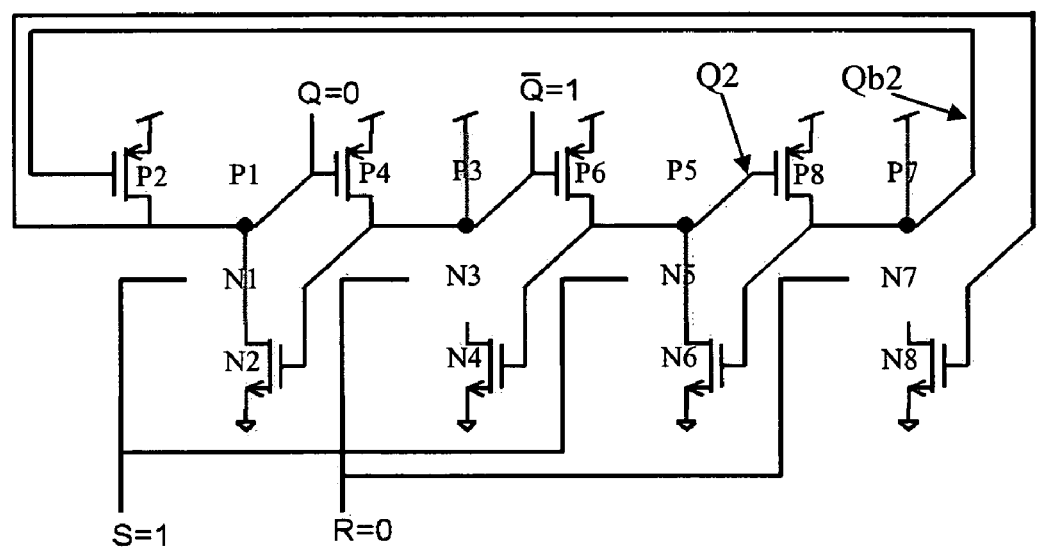
FIG. 8 illustrates schematic circuitry for a SEUSSNand in the Reset Condition.

Referring to FIG. 8 a SEUSSNand 800 under a Reset (S=1 and R=0) is shown. Transistors that are off (open) under these conditions (P1, P5, N3, and N7) have been removed from the figure. Transistors that are on (closed) under these conditions (N1, N5, P3 and P7) have been replaced with wires in the figure. It is easy to see that under these conditions, nodes Qbar and Qb2 are immediately pulled to power (logical 1). Moreover, nothing can prevent those nodes from being pulled to power because transistors N3 and N7 (which are off) cut those nodes away from any transistors that might try to pull those nodes to a logical 0. Once Qbar and Qb2 are at a logical 1, transistors P2 and P6 are turned off while transistors N2 and N6 are turned on, pulling nodes Q and Q2 low without opposition. With these last two nodes pulled to a logical 0, P4 and P8 are turned on and N4 and N8 are turned off, locking the new state (Q=0, Qbar=1), as required by the Reset.

Figure 9:
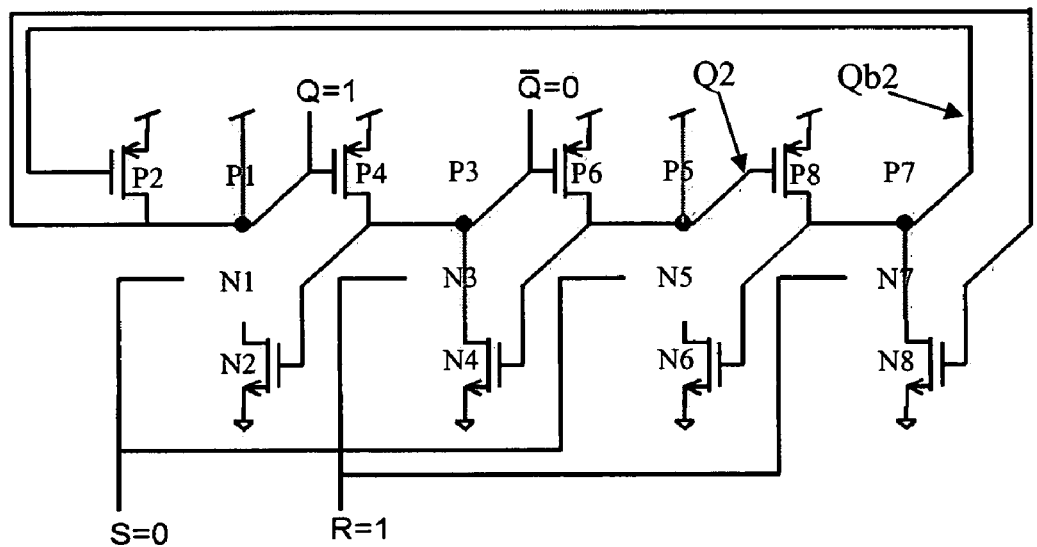
FIG. 9 illustrates schematic circuitry for a SEUSSNand in the Set Condition.

Referring to FIG. 9 a SEUSSNand 900 under a Set (S=0 and R=1) is shown. Transistors that are off (open) under these conditions (N1, N5, P3, and P7) have been removed from FIG. 9. Transistors that are on (closed) under these conditions (P1, P5, N3 and N7) have been replaced with wires. It is easy to see that under these conditions, nodes Q and Q2 are immediately pulled to power (logical 1). Moreover, nothing can prevent those nodes from being pulled to power because transistors N1 and N5 (which are off) cut those nodes away from any transistors that might try to pull those nodes to a logical 0. Once Q and Q2 are at a logical 1, transistors P4 and P8 are turned off while transistors N4 and N8 are turned on, pulling nodes Qbar and Qb2 low without opposition. With these last two nodes pulled to a logical 0, P2 and P6 are turned on and N2 and N6 are turned off, locking the new state (Q=1, Qbar=0), as required by the Set.

Figure 10:
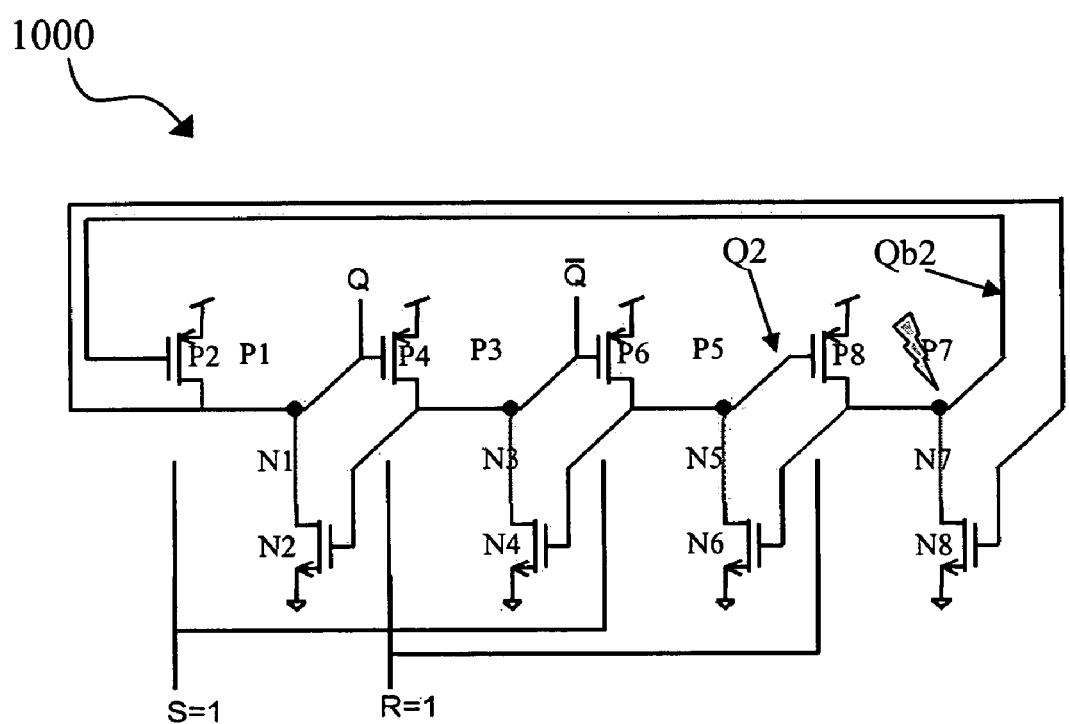
FIG. 10 illustrates schematic circuitry for a SEUSSNand in the Hold Condition.
Figure 11:
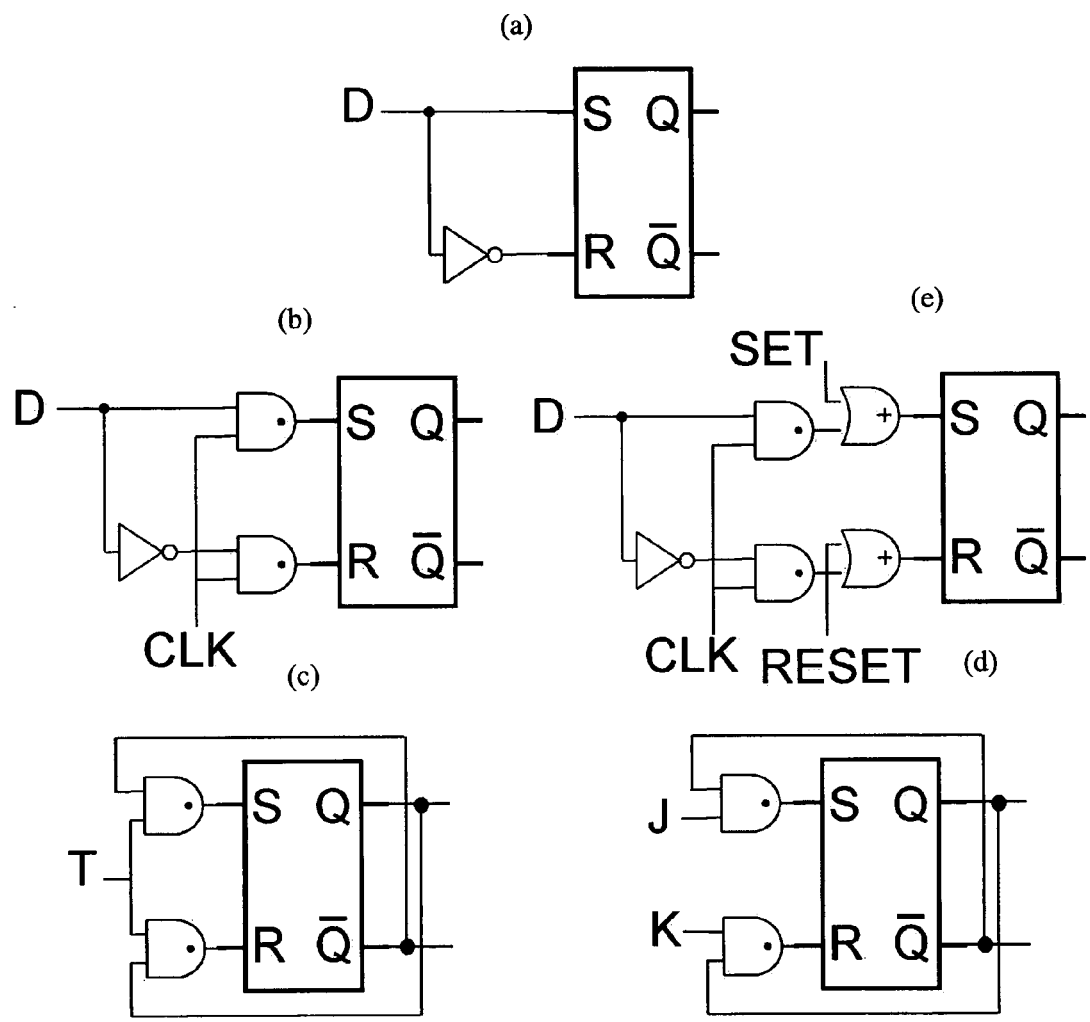
FIG. 11a–d illustrates sequential creation of a SEU tolerant SR-latch.

Referring to FIG. 10 a SEUSSNand 1000 under a Hold (S=1 and R=1) is shown. If both S and R are set to Zero, then P1, P3, P5, and P7 are all cut off. Meanwhile, N1, N3, N5, and N7 are all shorted. Note that under these conditions, the SEUSS Cell now actually resembles the DICE cell (FIG. 2) minus its input transistors. If Q is a One, then so is Q2, and Qbar and Qbar2 are Zeros. Under these conditions, N6 and N2 are cut off, severing Nodes Q and Q2 from ground. Meanwhile, N4 and N8 are shorted, holding Qbar and Qb2 as logical Ones. Also, P4 and P8 are cut off, severing Qbar and Qb2 from power while P2 and P6 are shorted to power holding Q and Q2 as logical 1s. In other words, if Nodes Q and Q2 are both logical Ones, then they are held as logical Ones when S and R are both Zeros. Similarly, if Nodes Q and Q2 are both logical Zeros, then they are held as logical Zeros when S and R are both Zeros.

If both S and R of a SEUSSNand are set to Zero, then there are multiple shorts from power to ground, and it is impossible to predict what state the circuit is in. This is an unknown state.

From the preceding paragraphs, it is obvious that under all conditions the SEUSSNand cell obeys the canonical form of a cross-coupled Nand Gate, negative-logic SR flip-flop depicted in the table embedded within FIG. 7. Assuming that the SEUSSNand is holding a logical 1 (i.e. Q=1, Qbar=0, Q2=1, and Qb2=0), and that there is upset as shown in the figure by the lightening bolt, the upset can deposit charge on Qb2 that would pull it up or down in voltage. Of course, an upset that pulls Qb2 down would have no effect on the state of the SEUSSNand, because under the present assumptions, Qb2 is already low. If, however, the upset tries to pull Qb2 up, several things happen. Transistor N8 will immediately attempt to pull Qb2 back down. Moreover, the gate of transistor N8 is controlled by node Q. Q itself is controlled by transistors P2 and N2. The gate of N2 is unaffected by the upset and N2 will remain cut off (the gate of N2 is controlled by Qbar which is a 0). Qb2, the node that is being upset, controls the gate of P2. If Qb2 is low, P8 actively pulls Q2 to high. If Qb2 is high, P8 is cut off, and nothing pulls Q high. Since this upset is driving Qb2 high, P8 will be cut off. The voltage value of node Q will remain unchanged (high) because nothing is pulling it low (N2 is cut-off)and it is that voltage on Q that will continue to keep transistor N8 alive and restoring the upset Qb2 back to its nominal value. Similarly, the voltage on Qb2 controls the gate of N6. If Qb2 is low, N6 is cut off. If Qb2 is high, N6 actively tries to pull node Q2 to ground. Meanwhile, the upset on Qb2 will try to turn transistor N6 on. However, P6 is still on and controlled by Qbar, which is unaffected by the upset. Therefore, the voltage value of node Q2 will change but it will move from its nominal value slowly, under the conflicting influence of both N6 and P6. The single event upset, on the other hand, is a rapid event, and N8 will be restoring Qb2 to its nominal value faster than Q2 will be moving away from its nominal value. Moreover, as the upset is restored through N8 and Qb2 is returning to its nominal value, transistor N6 will become weaker and weaker until it is finally cut off. Then P6 will restore Q to its nominal value, and the upset will be mitigated.

The internal transistors of a SEUSSNand (N1, P1), (N2, P2), (N3, P3), (N4, P4), (N5, P5), (N6, P6), (N7, P7), and (N8, P8) can be made as large or as small as desired. In short, the unique cell design set forth herein in accordance with features of the present invention requires no transistor ratios and could be designed in the minimum sized transistors available to any process, is alternatively designable in either specifically rad hard processes, standard commercial processes or standard commercial processes using radiation tolerant layout techniques, is inherently scalable from process to process, and requires no overdriving of its internal state.

The beauty of an SR latch is two-fold. First, SR latches are the fundamental building block of sequential logic in that any latch can be created from an SR latch as shown in FIGS. 11a–d. With the addition of a single inverter, the SR latch becomes a D latch (a). With two AND gates and an inverter, it becomes a clocked, D latch (b). With two AND gates, it becomes a T or Toggle flip-flop (c). With two AND gates organized slightly differently, it becomes a JK-flip-flop (d). Two and-or-inverts plus an inverter turn the SR latch into a clocked, D latch with asynchronous sets and resets (e). By extension, the same can be done with SEUSS Cells. Above all, since the SEUSS cells are SEU tolerant and since these transformation do not affect the internal structure of the SEUSS Cells, the D-latch, clocked D-Latch, T flip-flop, JK flip-flop, and asynchronously settable and re-settable clocked D-Latch all have the same SEU tolerance. Finally and obviously, a second benefit of the SR latch is that is inherently capable of asynchronous sets and resets.

The new SEUSSNor and SEUSSNand cell designs described herein are very robust in overall design and yield an SEU tolerance that is statistically identical to the SEU tolerance of a DICE Cell according to test results (13.8±4.0× $10^{-18}$ cm/bit).

Perhaps the most beneficial aspect of the SEU Registers is their flexibility. To illustrate this, the present inventor set out to develop something that could not be easily done with existing SEU tolerant registers, resulting in a Triple Redundancy circuits or TRed circuits.

Figure 12:
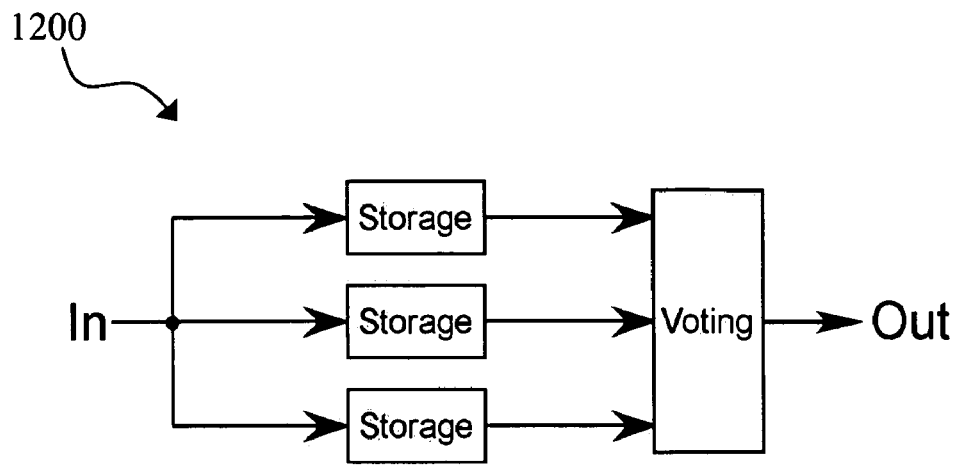
FIG. 12 illustrates a schematic diagram of a model for a canonical Triple Redundant SR-latch.

Triple Redundancy is a long established method for dealing with Single Event Upsets. Data is simultaneously stored in three identical memory cells. When it is read out, the contents of the three cells are compared and the output is determined by the rule of the majority—i.e. if there are two or three Ones, the output is a One; if there are two or three Zeros, the output is a Zero. A schematic model 1200 for the canonical Triple Redundant format of the present invention is illustrated in FIG. 12.

Any storage cell can be used in the canonical form, whether it is a normal register or a cell designed in accordance with features of the present invention, or one of the other SEU tolerant cells. Under these conditions, reliability is expressed as $$R_{NMR}(t) = \sum_{i=0}^{n-1} \frac{\lambda t}{i!} e^{-\lambda t}$$

where t is time, $\lambda$ is the failure rate and n is the number of redundant storage cells—in this case 3. All that is improved in a Triple Redundant memory by the inclusion of an SEU tolerant cell is an improvement in the failure rate, $\lambda$.

Figure 13:
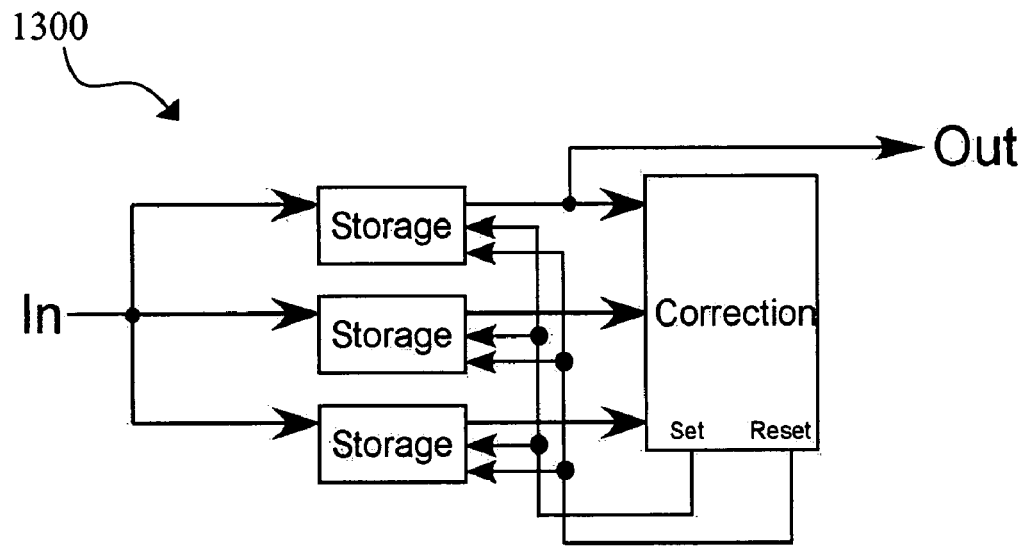
FIG. 13 illustrates a more sophisticated model of a triple redundant SEU tolerant SR-latch.

A more sophisticated implementation of Triple Redundancy in accordance with features of the present invention can be referred to as Triple Redundancy with Correction 1300, as illustrated in FIG. 13. In an ideal world, all three storage elements hold the same value—i.e., 1,1,1 or 0,0,0. In the presence of radiation, however, it is possible for the circuit to hold 2 Ones and a Zero or 2 Zeros and a One. Triple Redundancy with Correction allows the circuit to detect the presence of these error conditions and correct the cell back to its ideal state. Under these conditions, the circuit reliability improves to:

$$A(t) = R(t) + \int_0^t R(t-x) dM(x)$$

where t is still time, R(t) is the circuit reliability from the previous equation and M(x) is a function related to the repair time of the correcting circuit.

Such a circuit shows a dramatic improvement in reliability for data that is being held for a considerable amount of time—i.e., times long with respect to the repair time. The notable thing about Triple Redundancy with Correction circuits is that they either require asynchronous sets and resets or they require a high speed "correction clock" whose job it is to periodically activate the clocked redundant storage latches to allow them to be corrected. Needless to say, the practical limitations associated a secondary correction clock are manifold. For example, correction can only happen in discrete units of time. Since single event upsets are random, it is possible that a second upset could occur before the first was corrected. Two upsets can prove fatal in a triply redundant system. Second, since there is more than one clock (i.e. the input or "main" clock and the correction clock), some considerable effort is required to coordinate the two clocks or ensure that such coordination is unnecessary. Thirdly, some considerable effort is necessary to ensure that "corrections" do not overwrite new input data. Simply stated, in the absence of asynchronous sets and resets, Triple Redundancy with Correction is not done. Triple redundancy with correction circuits are therefore a clear application of the unique registers of the present invention. Not only will registers described herein improve the reliability of the storage cells, but they will also permit correction circuitry to repair errors.

While developing this circuitry, it occurred to the present inventor that the flexibility of the SEU cells would actually allow the triple redundant with correction circuit itself to emulate either a positive logic or negative logic SR latch. If this were the case, then the triple redundant with correction logic could be repeated again and again, always resulting in a circuit that emulated an SR latch. Accordingly, an almost arbitrarily redundant circuit can be developed depending on the reliability being sought for a given application, and according to how much space can be committed for redundancy. No matter the number of redundancy sets used in a custom circuit, the resulting circuitry can still be converted it into whatever type of latch is required for an application by adding the appropriate external circuitry to the redundant circuitry. This is possible because SR latches are the fundamental building blocks of sequential circuitry.

Figure 14:
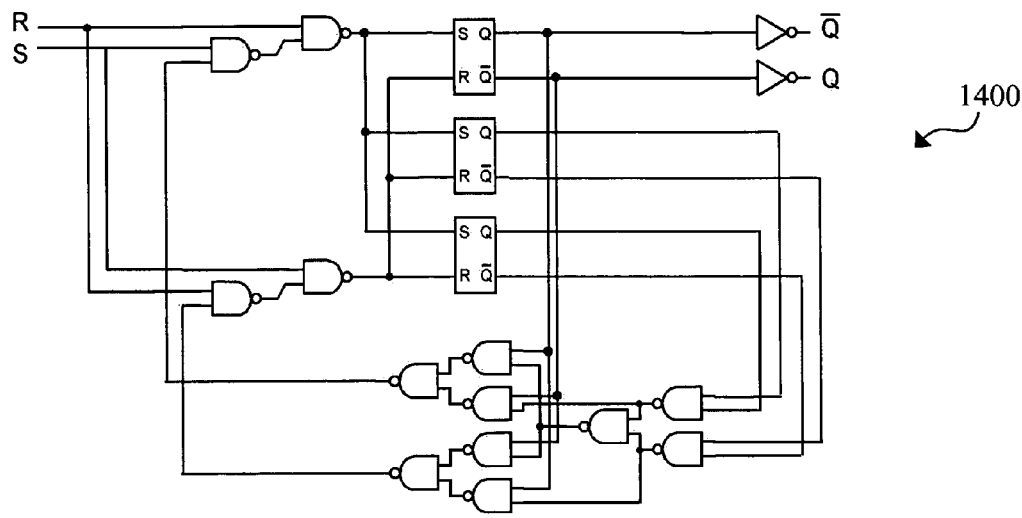
FIG. 14 illustrates a simplified block diagram for a triple redundant SEU tolerant SR-latch with correction.
Figure 15:
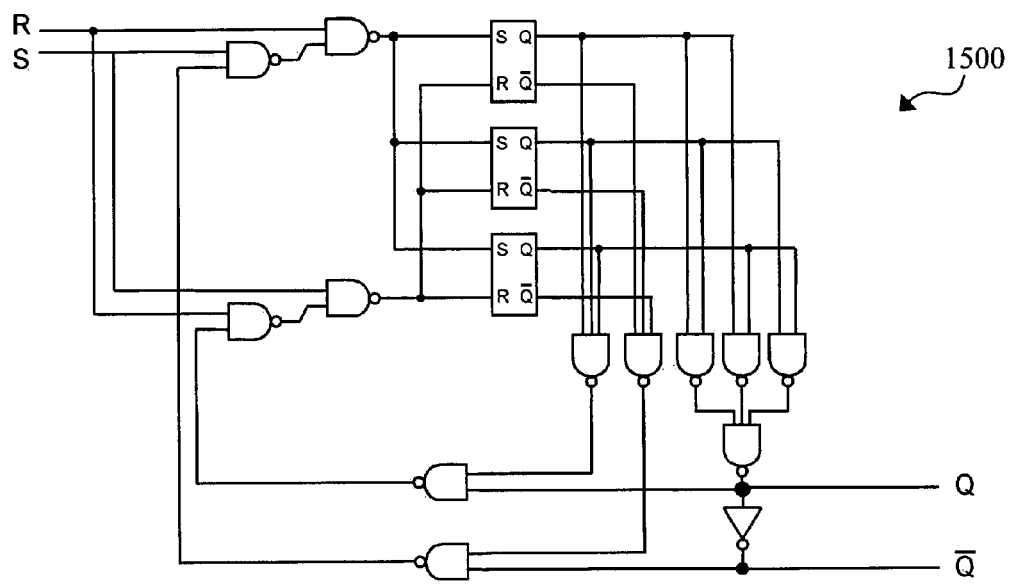
FIG. 15 illustrates another triple redundant SEU tolerant SR-latch with correction.

A simplified block diagram for a triple redundant SR latch 1400 with correction is illustrated in FIG. 14. It can be referred to as a TRed1. A second triple redundant SR latch with correction 1500 is illustrated in FIG. 14. It can be referred to as a TRed2. Both circuits emulate positive logic SR latches. Both can be made arbitrarily redundant by repeated nesting of redundant SR latches within larger redundant SR latches. TRed1 has a speed advantage since its output comes directly from one of the storage elements. Its triple redundancy is used solely for purposes of auto-correction. TRed2 has considerable SEU tolerance advantage since its output is truly a result of voting.

The present invention does not require special transistor ratios and can be designed with any internal transistor sizes. The cells of the present invention can be designed in a rad hard process or a commercial process, either using radiation tolerant layout techniques or not. The cells are inherently scalable from one process to another. It does not matter what size the internal transistors are; therefore, it does not matter what process they are designed in. An SEU cell in accordance with the present invention requires no overdriving and produces no back drive. The next state of an SEU Cell can be guaranteed from its inputs. The present invention provides cells that are inherently capable of asynchronous sets and resets.

The invention claimed is:

1. A system comprising:
   transistors adapted to operate as an SR flip-flop wherein each one of the transistors has an insulated gate and wherein the SR flip-flop is a SEUSSNor comprising:
   a power node and four p type transistors named P2, P4, P6, and P8 wherein the sources of P2, P4, P6, and P8 are connected to the power node;
   a ground node and eight n type transistors named N1, N2, N3, N4, N5, N6, N7, and N8 wherein the sources of N1, N2, N3, N4, N5, N6, N7, and N8 are connected to the ground node;
   a p type transistor called P1 wherein the source of P1 is connected to the drain of P2;
   a p type transistor called P3 wherein the source of P3 is connected to the drain of P4;
   a p type transistor called P5 wherein the source of P5 is connected to the drain of P6;
   a p type transistor called P7 wherein the source of P7 is connected to the drain of P8;
   an S input connected to the gate of P1, the gate of N1, the gate of N5 and the gate of P5;
   an R input connected to the gate of P3, the gate of N3, the gate of N7 and the gate of P7;
   a Q2 node connected to the gate of P2, the gate of N6, the drain of N7, the drain of P7, and the drain of N8;
   a Qbar node connected to the gate of P4, the gate of N8, the drain of N1, the drain of P1, and the drain of N2;
   a Q node connected to the gate of P6, the gate of N2, the drain of N3, the drain of P3, and the drain of N4; and
   a Qbar2 node connected to the gate of P8, the gate of N4, the drain of N5, the drain of P5, and the drain of N6.

2. The system of claim 1 further comprising at least two more SR flip flops and a voting circuit such that the circuit output is the majority output of all of the SR flip-flops.

3. The system of claim 1 further comprising:
   a two input NAND gate called G1 wherein the first input of G1 is connected to a TRed2 R input node and the output of G1 is connected to the S input;
   a two input NAND gate called G2 wherein the first input of G2 is connected to a TRed2 S input node and the output of G2 is connected to the second input of G1;
   a two input NAND gate called G3 wherein the first input of G3 is connected to the TRed2 S input node and the output of G3 is connected to the R input;
   a two input NAND gate called G4 wherein the first input of G4 is connected to the TRed2 R input node and the output of G4 is connected to the second input of G3;
   an SR flip-flop called SR2 wherein the S input of SR2 is connected to the output of G1 and the R input of SR2 is connected to the output of G3;
   an SR flip-flop called SR3 wherein the S input of SR3 is connected to the output of G1 and the R input of SR3 is connected to the output of G3;
   a three input NAND gate called G5 wherein the first input of G5 is connected to either the Q node or the Q2 node, the second input of G5 is connected to the Q output of SR2, and the third input of G5 is connected to the Q output of SR3;
   a three input NAND gate called G6 wherein the first input of G6 is connected to either the Qbar node or the Qbar2 node, the second input of G6 is connected to the Qbar output of SR2, and the third input of G6 is connected to the Qbar output of SR3;
   a two input NAND gate called G7 wherein the first input of G7 is connected to either the Q node or the Q2 node and the second input of G7 is connected to the Q output of SR2;
   a two input NAND gate called G8 wherein the first input of G8 is connected to either the Q node or the Q2 node and the second input of G8 is connected to the Q output of SR3;
   a two input NAND gate called G9 wherein the first input of G9 is connected to the Q output of SR2 and the second input of G9 is connected to the Q output of SR3;
   a three input NAND gate called G10 wherein the first input of G10 is connected to the output of G7, the second input of G10 is connected to the output of G8, the third input of G10 is connected to the output of G9, and the output of G10 is connected to a TRed2 Q output node;
   an inverter called I1 wherein the input of I1 is connected to the TRed2 Q output node and the output of I1 is connected to a TRed2 Qbar output node;
   a two input NAND gate called G11 wherein the first input of G11 is connected to the output of G5 and the second input of G11 is connected to the output of G10 and the output of G11 is connected to the second input of G4; and
   a two input NAND gate called G12 wherein the first input of G12 is connected to the output of G6 and the second input of G12 is connected to the output of I1 and the output of G12 is connected to the second input of G2.

4. The system of claim 1 further comprising at least two more SR flip flops and a correction circuit such that the circuit output is the corrected output of all of the SR flip-flops.

5. The system of claim 1 further comprising:
a two input NAND gate called G1 wherein the first input of G1 is connected to a TRed1 R input node and the output of G1 is connected to the S input;
a two input NAND gate called G2 wherein the first input of G2 is connected to a TRed1 S input node and the output of G2 is connected to the second input of G1;
a two input NAND gate called G3 wherein the first input of G3 is connected to the TRed1 S input node and the output of G3 is connected to the R input;
a two input NAND gate called G4 wherein the first input of G4 is connected to the TRed1 R input node and the output of G4 is connected to the second input of G3;
an SR flip-flop called SR2 wherein the S input of SR2 is connected to the output of G1 and the R input of SR2 is connected to the output of G3;
an SR flip-flop called SR3 wherein the S input of SR3 is connected to the output of G1 and the R input of SR3 is connected to the output of G3;
a TRed1 Q node connected to either the Q node or the Q2 node;
a TRed1 Qbar node connected to either the Qbar node or the Qbar2 node;
a two input NAND gate called G11 wherein the first input of G11 is connected to the Q output of SR2 and the second input of G11 is connected to the Q output of SR3;
a two input NAND gate called G12 wherein the first input of G12 is connected to the Qbar output of SR2 and the second input of G12 is connected to the Qbar output of SR3;
a two input NAND gate called G13 wherein the first input of G13 is connected to the output of G11 and the second input of G13 is connected to the output of G12;
a two input NAND gate called G5 wherein the first input of G5 is connected to the TRed1 Q node and the second input of G5 is connected to the output of G13;
a two input NAND gate called G6 wherein the first input of G6 is connected to the TRed1 Qbar node and the second input of G6 is connected to the output of G11;
a two input NAND gate called G7 wherein the first input of G7 is connected to the output of G5, the second input of G7 is connected to the output of G6 and the output of G7 is connected to the second input of G2;
a two input NAND gate called G8 wherein the first input of G8 is connected to the TRed1 Qbar node and the second input of G8 is connected to the output of G13;
a two input NAND gate called G9 wherein the first input of G9 is connected to the TRed1 Q node and the second input of G9 is connected to the output of G12; and
a two input NAND gate called G10 wherein the first input of G10 is connected to the output of G8, the second input of G10 is connected to the output of G9 and the output of G10 is connected to the second input of G4.

6. A system comprising:
transistors adapted to operate as an SR flip-flop wherein each one of the transistors comprises has an insulated gate and wherein the SR flip-flop is a SEUSSNand comprising:
a power node and eight p type transistors named P1, P2, P3, P4, P5, P6, P7, and P8 wherein the sources of P1, P2, P3, P4, P5, P6, P7, and P8 are connected to the power node;
a ground node and four n type transistors named N2, N4, N6, and N8 wherein the sources of N2, N4, N6, and N8 are connected to the ground node;
an n type transistor called N1 wherein the source of N1 is connected to the drain of N2;
an n type transistor called N3 wherein the source of N3 is connected to the drain of N4;
an n type transistor called N5 wherein the source of N5 is connected to the drain of N6;
an n type transistor called N7 wherein the source of N7 is connected to the drain of N8;
an S input connected to the gate of P1, the gate of N1, the gate of N5 and the gate of P5;
an R input connected to the gate of P3, the gate of N3, the gate of N7 and the gate of P7;
a Qbar2 node connected to the gate of P2, the gate of N6, the drain of P7, the drain of N7, and the drain of P8;
a Q node connected to the gate of P4, the gate of N8, the drain of N1, the drain of P1, and the drain of P2;
a Qbar node connected to the gate of P6, the gate of N2, the drain of N3, the drain of P3, and the drain of P4; and
a Q2 output node connected to the gate of P8, the gate of N4, the drain of N5, the drain of P5, and the drain of P6.

7. The system of claim 6 further comprising at least two more SR flip flops and a voting circuit such that the circuit output is the majority output of all of the SR flip-flops.

8. The system of claim 6 further comprising:
a two input NAND gate called G1 wherein the first input of G1 is connected to a TRed2 R input node and the output of G1 is connected to the S input;
a two input NAND gate called G2 wherein the first input of G2 is connected to a TRed2 S input node and the output of G2 is connected to the second input of G1;
a two input NAND gate called G3 wherein the first input of G3 is connected to the TRed2 S input node and the output of G3 is connected to the R input;
a two input NAND gate called G4 wherein the first input of G4 is connected to the TRed2 R input node and the output of G4 is connected to the second input of G3;
an SR flip-flop called SR2 wherein the S input of SR2 is connected to the output of G1 and the R input of SR2 is connected to the output of G3;
an SR flip-flop called SR3 wherein the S input of SR3 is connected to the output of G1 and the R input of SR3 is connected to the output of G3;
a three input NAND gate called G5 wherein the first input of G5 is connected to either the Q node or the Q2 output node, the second input of G5 is connected to the Q output of SR2, and the third input of G5 is connected to the Q output of SR3;
a three input NAND gate called G6 wherein the first input of G6 is connected to either the Qbar node or the Qbar2 node, the second input of G6 is connected to the Qbar output of SR2, and the third input of G6 is connected to the Qbar output of SR3;
a two input NAND gate called G7 wherein the first input of G7 is connected to either the Q node or the Q2 output node and the second input of G7 is connected to the Q output of SR2;
a two input NAND gate called G8 wherein the first input of G8 is connected to either the Q node or the Q2 output node and the second input of G8 is connected to the Q output of SR3;
a two input NAND gate called G9 wherein the first input of G9 is connected to the Q output of SR2 and the second input of G9 is connected to the output of SR3;

a three input NAND gate called G10 wherein the first input of G10 is connected to the output of G7, the second input of G10 is connected to the output of G8, the third input of G10 is connected to the output of G9, and the output of G10 is connected to a TRed2 Q output node;

an inverter called I1 wherein the input of I1 is connected to the TRed2 Q output node and the output of I1 is connected to a TRed2 Qbar output node;

a two input NAND gate called G11 wherein the first input of G11 is connected to the output of G5 and the second input of G11 is connected to the output of G10 and the output of G11 is connected to the second input of G4; and a two input NAND gate called G12 wherein the first input of G12 is connected to the output of G6 and the second input of G12 is connected to the output of I1 and the output of G12 is connected to the second input of G2.

9. The system of claim 6 further comprising at least two more SR flip flops and a correction circuit such that the circuit output is the corrected output of all of the SR flip-flops.

10. The system of claim 6 further comprising:

a two input NAND gate called G1 wherein the first input of G1 is connected to a TRed1 R input node and the output of G1 is connected to the S input;

a two input NAND gate called G2 wherein the first input of G2 is connected to a TRed1 S input node and the output of G2 is connected to the second input of G1;

a two input NAND gate called G3 wherein the first input of G3 is connected to the TRed1 S input node and the output of G3 is connected to the R input;

a two input NAND gate called G4 wherein the first input of G4 is connected to the TRed1 R input node and the output of G4 is connected to the second input of G3;

an SR flip-flop called SR2 wherein the S input of SR2 is connected to the output of G1 and the R input of SR2 is connected to the output of G3;

an SR flip-flop called SR3 wherein the S input of SR3 is connected to the output of G1 and the R input of SR3 is connected to the output of G3;

a TRed1 Q node connected to either the Q node or the Q2 output node;

a TRed1 Qbar node connected to either the Qbar node or the Qbar2 node;

a two input NAND gate called G11 wherein the first input of G11 is connected to the Q output of SR2 and the second input of G11 is connected to the Q output of SR3;

a two input NAND gate called G12 wherein the first input of G12 is connected to the Qbar output of SR2 and the second input of G12 is connected to the Qbar output of SR3;

a two input NAND gate called G13 wherein the first input of G13 is connected to the output of G11 and the second input of G13 is connected to the output of G12;

a two input NAND gate called G5 wherein the first input of G5 is connected to the TRed1 Q node and the second input of G5 is connected to the output of G13;

a two input NAND gate called G6 wherein the first input of G6 is connected to the TRed1 Qbar node and the second input of G6 is connected to the output of G11;

a two input NAND gate called G7 wherein the first input of G7 is connected to the output of G5, the second input of G7 is connected to the output of G6 and the output of G7 is connected to the second input of G2;

a two input NAND gate called G8 wherein the first input of G8 is connected to the TRed1 Qbar node and the second input of G8 is connected to the output of G13;

a two input NAND gate called G9 wherein the first input of G9 is connected to the TRed1 Q node and the second input of G9 is connected to the output of G12; and a two input NAND gate called G10 wherein the first input of G10 is connected to the output of G8, the second input of G10 is connected to the output of G9 and the output of G10 is connected to the second input of G4.

* * * * *